United States Patent
Delanghe et al.

(10) Patent No.: US 7,218,258 B2
(45) Date of Patent: May 15, 2007

(54) METHOD AND SYSTEM FOR MIXED ANALOG-DIGITAL AUTOMATIC GAIN CONTROL

(75) Inventors: Brad Delanghe, Sunnyvale, CA (US); Aleksandr Movshovich, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/869,367

(22) Filed: Jun. 16, 2004

(65) Prior Publication Data

US 2005/0174274 A1 Aug. 11, 2005

Related U.S. Application Data

(60) Provisional application No. 60/542,587, filed on Feb. 5, 2004.

(51) Int. Cl.
*H03M 1/06* (2006.01)

(52) U.S. Cl. .................. 341/118; 341/139; 341/131

(58) Field of Classification Search ............. 341/139, 341/142, 143, 155, 118, 120; 455/234.1, 455/245.2, 250.1; 330/9, 133, 278
See application file for complete search history.

(56) References Cited

U.S. PATENT DOCUMENTS

| | | | | |
|---|---|---|---|---|
| 5,351,050 A | * | 9/1994 | Thompson et al. ......... | 341/143 |
| 5,732,334 A | * | 3/1998 | Miyake ..................... | 455/126 |
| 5,812,077 A | * | 9/1998 | Boie ......................... | 341/118 |
| 5,838,272 A | * | 11/1998 | Steiner et al. .............. | 341/143 |
| 5,844,512 A | * | 12/1998 | Gorin et al. ................ | 341/139 |
| 5,990,814 A | * | 11/1999 | Croman et al. ............ | 341/118 |
| 6,057,891 A | * | 5/2000 | Guerin et al. .............. | 348/572 |
| 6,215,427 B1 | * | 4/2001 | Bonhoure et al. ......... | 341/118 |
| 6,353,405 B1 | * | 3/2002 | Yang et al. ................. | 341/155 |
| 6,441,684 B1 | * | 8/2002 | Nakamura ................... | 330/9 |
| 6,459,397 B1 | * | 10/2002 | Olgaard et al. ............ | 341/143 |
| 6,498,927 B2 | * | 12/2002 | Kang et al. ............. | 455/245.2 |
| 2004/0062326 A1 | * | 4/2004 | Burke et al. ............... | 375/345 |

* cited by examiner

*Primary Examiner*—Linh Nguyen
(74) *Attorney, Agent, or Firm*—McAndrews Held and Malloy, Ltd.

(57) ABSTRACT

Aspects of the invention provide a method and system for a mixed analog-digital automatic gain control. The received analog signal is amplified by the analog amplifier and then converted to a digital value by an ADC. A clamp reference level of the converted signal is removed prior to applying a digital gain to a digital multiplied. Once the digital gain is applied, the clamp reference level is restored to the digital signal. A loop filter determines the system time response from the error between an amplitude parameter of the received signal and an AGC reference level. A gain separation circuit generates the system gain and separates it into a digital gain and an analog gain in a way to maximize the use of the analog amplifier. The analog gain is applied to the analog amplifier and the digital gain is applied to the digital multiplier.

20 Claims, 5 Drawing Sheets

METHOD AND SYSTEM FOR MIXED ANALOG-DIGITAL AUTOMATIC GAIN CONTROL

CROSS-REFERENCE TO RELATED APPLICATIONS/INCORPORATION BY REFERENCE

This application makes reference to, claims priority to, and claims the benefit of: U.S. Provisional Application Ser. No. 60/542,587, filed Feb. 5, 2004.

The above stated application is hereby incorporated herein by reference in its entirety.

FIELD OF THE INVENTION

Certain embodiments of the invention relate to the processing of signals. More specifically, certain embodiments of the invention relate to a method and system for amplifying an incoming signal to provide a user-defined signal value.

BACKGROUND OF THE INVENTION

In some conventional signal processing systems it is necessary to convert a wide range of incoming analog signal amplitudes into a user-defined signal value. In systems requiring analog signal receivers such as video systems, data storage systems, medical devices, remote sensors, and many legacy communication systems, the conversion of incoming signals to a user-defined signal value simplifies the overall system design because it makes it possible to eliminate the need to compensate for the effects of channel gain variations. The ability to provide signal processing circuits with incoming signals of fixed average power allows system designers to reduce circuit and algorithmic complexity. An automatic gain control (AGC) circuit is a front-end system component that is used to provide the necessary amplification to the incoming signal to achieve the user-defined signal value. The amplification provided by the AGC circuit is called the system gain and could either increase or decrease the signal level according to what is needed to achieve the user-defined signal value. For systems where signal processing is digitally performed, the analog-to-digital converter (ADC) is located in the AGC circuit.

FIG. 1 is a schematic block diagram of a conventional AGC circuit. Referring to FIG. 1, the AGC circuit 100 comprises an analog front-end (AFE) 102, an error measurement circuit 104, an AGC reference level circuit 106, and a loop filter circuit 108. The AFE 102 comprises an analog amplifier 110 and an ADC 112. The error measurement circuit 104 comprises an AGC measurement circuit 114 and a digital adder circuit 116.

The AFE 102 is the analog portion of AGC circuit 100. The analog amplifier 110 is a variable gain amplifier with discrete gain levels. The ADC 112 is a fixed-bit analog-to-digital converter. The error measurement circuit 104 compares a specified incoming signal amplitude parameter to a user-defined AGC reference level and generates an error signal. The AGC reference level circuit 106 provides the AGC reference level used in error measurement circuit 104. The AGC measurement circuit 114 measures the specified incoming signal amplitude parameter. The digital adder 116 compares the measured parameter and the AGC reference level. The loop filter circuit 108 generates a system time constant, the system gain, and a system gain signal to select gain level in analog amplifier 100.

In operation, the incoming analog signal is amplified by analog amplifier 110 in AFE 102. The amplified analog signal is then digitized by ADC 112 in AFE 102. A specified signal amplitude parameter is measured by AGC measurement circuit 114 in error measurement circuit 104. The measured parameter is compared to the AGC reference level provided by AGC reference level circuit 106. This comparison takes place at digital adder circuit 116. The output of digital adder circuit 116 is an error signal representative of the comparison. The error signal is used by loop filter circuit 108 to generate the time response of AGC circuit 100 and to generate a new system gain. The system gain signal is generated form the system gain and is used to select the appropriate gain level in analog amplifier 110. If the measured parameter and the AGC reference level were the same, or were within a specified error range, the error signal will not produce a change in system gain and the gain level in analog amplifier 110 will not change. If the measured parameter and the AGC reference level were not the same, or were outside a specified error range, the loop filter circuit 108 generates a new system gain and system gain signal and the gain level in analog amplifier 110 is updated to reflect this new system gain.

The system gain in AGC circuit 100 is implemented entirely by the gain level selected in analog amplifier 110. Analog amplifier 100 must have very high gain resolution for AGC circuit 100 to achieve the desired user-defined signal value for a wide range of incoming analog signals. High resolution requires a large number of analog gain levels from which the appropriate analog gain may be selected by loop filter circuit 108. However, one of the difficulties is that the chip area required by analog amplifier 110 increases with the number of gain levels that it is designed to provide. The design of analog amplifiers in integrated circuits (IC) generally requires large areas on chip because of the large currents needed to drive high-capacitance loads at fast slew rates while providing high gains. The larger the number of gain levels, the larger the number of current driving elements that are needed to provide the desired resolution. Moreover, the complexity and size of the design is dependent on system requirements such as temperature stability, linearity, accuracy, low noise, wide bandwidth, and limiting the effects of voltage supply variations. The cost benefit associated with designing ever more complex digital signal processing circuits into smaller chip areas may be negated by the large area requirements of high gain resolution analog amplifiers. The large area needed by analog amplifier 110 in AGC circuit 100 thus limits the amount of chip area that may be used for digital signal processing circuits and for other chip components, for example, embedded memory, core processor units, and communication interfaces.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for a mixed analog-digital automatic gain control (AGC). Aspects of the method for signal gain control may comprise reducing the analog gain of an analog amplifier in an AGC circuit. Incoming analog signals are received by an analog front-end of the AGC circuit. The analog-front end may comprise the analog amplifier and an analog-to-digital converter (ADC). The chip area required by the analog amplifier may be reduced to reduce chip cost or to provide additional chip area for digital signal processing circuits and for other chip components, for example, embedded memory, core processor units, and communication interfaces. Reducing the area may result in fewer gain levels at the analog amplifier that may be applied to incoming analog signals. A digital gain may be applied after the ADC to compensate for at least a portion of the reduction in the analog gain. Because of the smaller area required by digital circuits, the digital gain may be achieved without adding significant chip area or cost.

When the amplified analog signal is digitized, the digital signal may be clamped by using a clamp reference level. The clamp reference level is removed from the digital signal before applying the digital gain. The clamp reference level is restored to the digital signal after applying the digital gain and may be a DC bias or a reference signal level representative of a particular application. The clamped digital signal may be measured to obtain at least one parameter that is representative of the incoming analog signal amplitude. The parameter to be measured may be selected based on the operation and requirements of the AGC circuit and on the type of incoming analog signal and its application. The measured parameter may be compared to a user-defined AGC reference level. The measured incoming signal amplitude parameter may be utilized to update the clamping reference level and to update the AGC reference level. An error signal may be generated from the comparison of the measured parameter and the AGC reference level. The error signal may be utilized by a loop filter circuit to determine the time response of the AGC circuit. The error signal may be averaged over time to generate an average error signal. The average error signal may be utilized to generate a system gain that may be utilized to amplify the incoming signal.

The system gain may be generated from the average error signal through the use of a look-up table. The analog gain may be generated from the system gain through the use of a look-up table. The analog gain may be generated based on the best or optimal use and operation of the analog amplifier. The digital gain may be generated from the system gain and the analog gain through the use of a look-up table.

Certain aspects of the system for a mixed analog-digital AGC may comprise an analog/digital gain separation circuit that generates the reduced analog gain that may be applied by the analog amplifier in the AGC circuit. The analog/digital gain separation circuit may generate the digital gain to be applied to the digitized signal to compensate for at least a portion of the reduction in the analog gain.

When the amplified analog signal is digitized by an ADC, the digital signal output may be clamped by a clamping circuit using a clamp reference level provided by a clamp reference level circuit. The clamp reference level is removed from the digital signal by the clamping circuit before applying the digital gain in a digital multiplier. The clamp reference level is restored to the digital signal by the clamping after applying the digital gain in the digital multiplier and may be a DC bias or a reference signal level representative of a particular application. The clamped digital signal may be measured by an AGC measurement circuit in an error measurement circuit to obtain at least one parameter that is representative of the incoming analog signal amplitude. The parameter to be measured may be selected by the error measurement circuit based on the operation and requirements of the AGC circuit and on the type of incoming analog signal and its application. The measured parameter may be compared by a digital adder to a user-defined AGC reference level provided by an AGC reference level circuit. The measured incoming signal amplitude parameter may be utilized by the error measurement circuit to update the clamping reference level and to update the AGC reference level. An error signal may be generated by the error measurement circuit from the comparison of the measured parameter and the AGC reference level. The error signal may be utilized by a loop filter circuit to determine the time response of the AGC circuit. The error signal may be averaged over time by the loop filter circuit to generate an average error signal. The average error signal may be utilized by an analog/digital gain separation circuit to generate a system gain that may be utilized to amplify the incoming signal.

The system gain may be generated by the analog/digital gain separation circuit from the average error signal through the use of a look-up table. The analog gain may be generated by the analog/digital gain separation circuit from the system gain through the use of a look-up table. The analog gain may be generated based on the best or optimal use and operation of the analog amplifier. The digital gain may be generated by the analog/digital gain separation circuit from the system gain and the analog gain through the use of a look-up table. At least one processor may be utilized to update registers and look-up tables in the analog/digital gain separation circuit.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a mixed analog-digital automatic gain control (AGC). Aspects of the method for signal gain control may comprise reducing the analog gain of an analog amplifier in an AGC circuit. Incoming analog signals are received by an analog front-end of the AGC circuit. The analog-front end may comprise the analog amplifier and an analog-to-digital converter (ADC). The chip area required by the analog amplifier may be reduced to reduce chip cost or to provide additional chip area for digital signal processing circuits and for other chip components, for example, embedded memory, core processor units, and communication interfaces. Reducing the area may result in fewer gain levels at the analog amplifier that may be applied to incoming analog signals. A digital gain may be applied after the ADC to compensate for at least a portion of the reduction in the analog gain. Because of the smaller area required by digital circuits, the digital gain may be achieved without adding significant chip area or cost.

Figure 1:
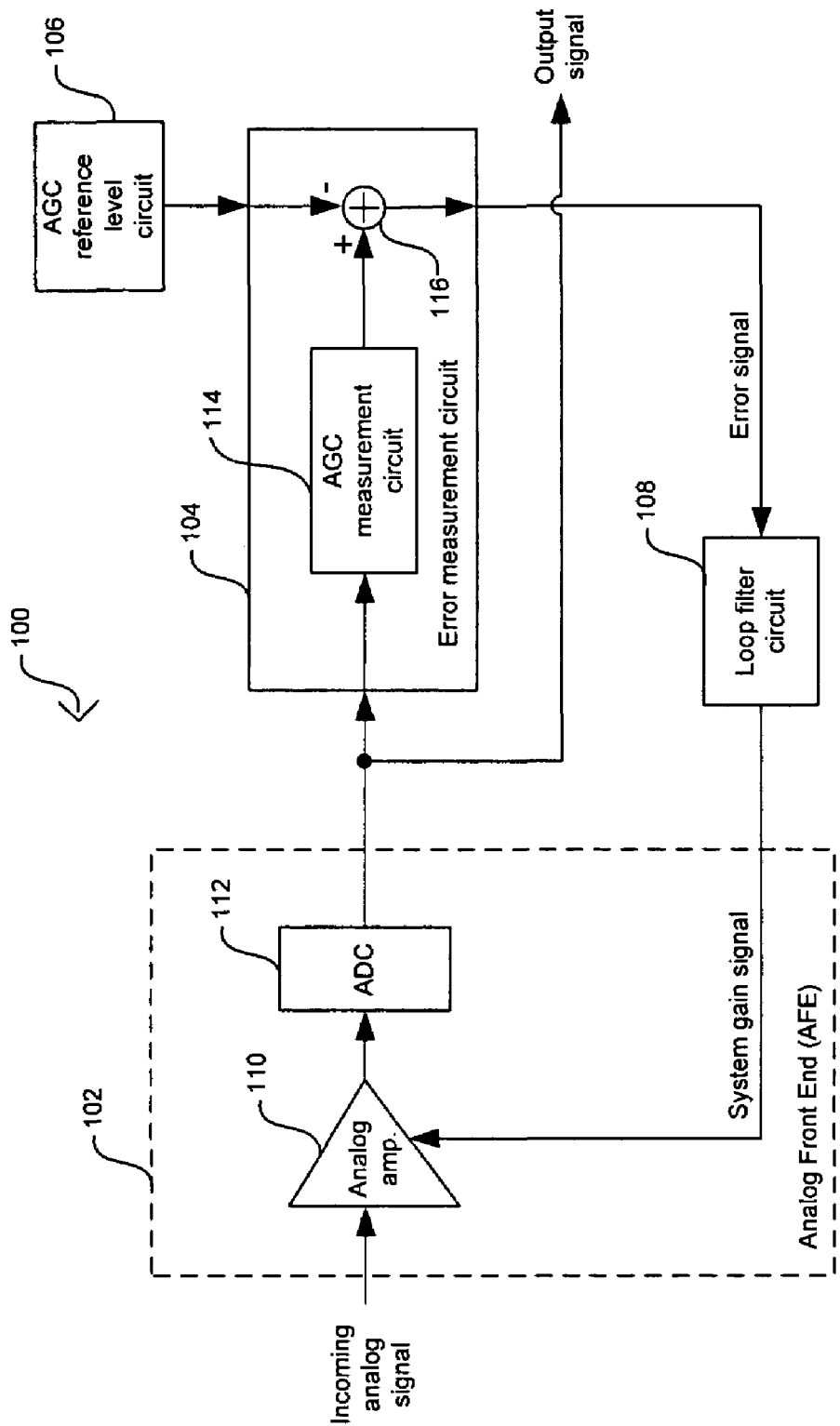
FIG. 1 is a schematic block diagram of a conventional AGC circuit.
Figure 2A:
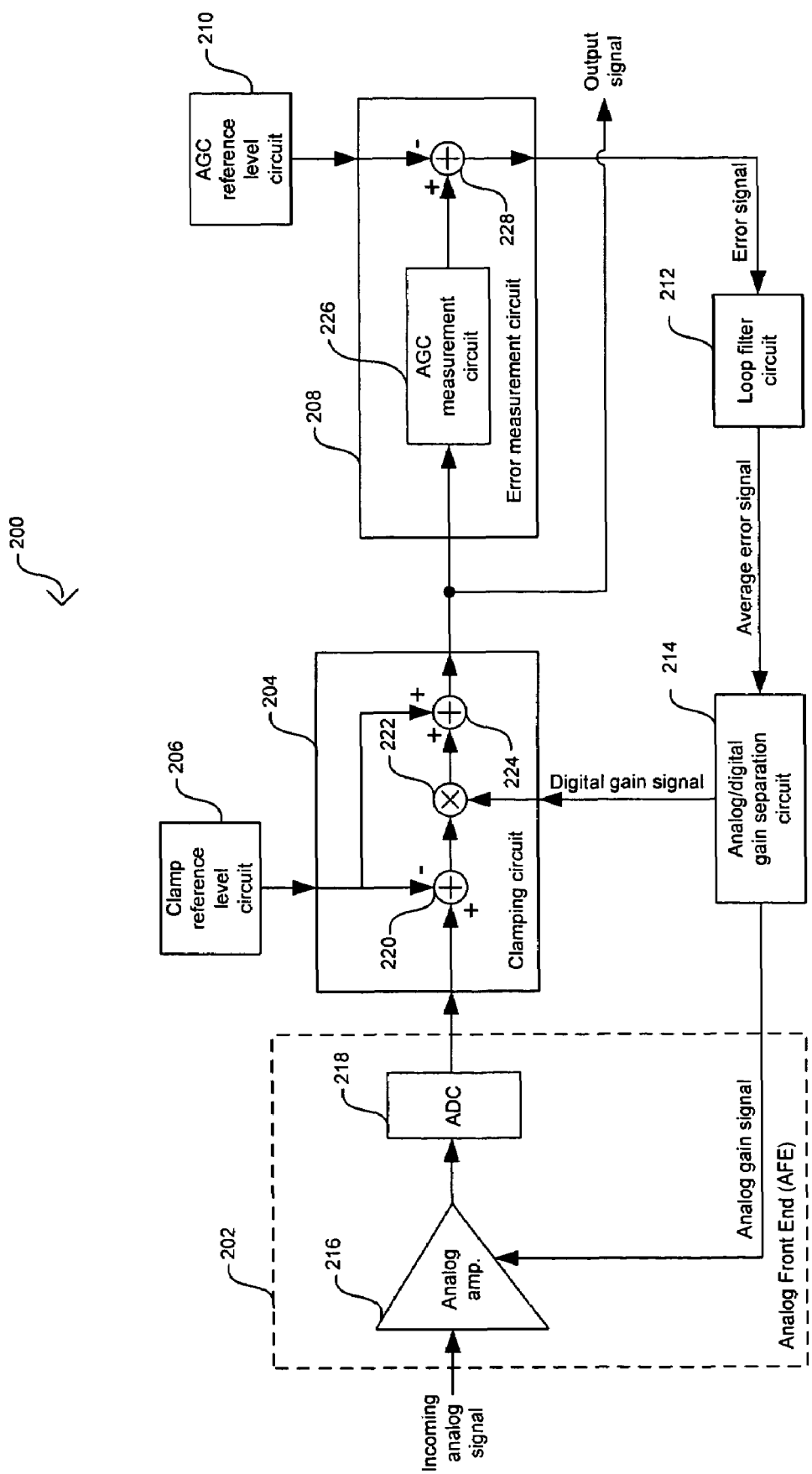
FIG. 2A is a schematic block diagram of a mixed analog-digital AGC circuit, in accordance with an embodiment of the present invention.

FIG. 2A is a schematic block diagram of a mixed analog-digital AGC circuit, in accordance with an embodiment of the present invention. The AGC circuit 200 may comprise an Analog Front End (AFE) 202, a clamping circuit 204, a clamp reference level circuit 206, an error measurement circuit 208, an AGC reference level circuit 210, a loop filter circuit 212, and an analog/digital gain separation circuit 214. The AFE 202 may comprise an analog amplifier 216 and an ADC 218. The clamping circuit 204 may comprise a first digital adder 220, a digital multiplier 222, and a second digital adder 224. The error measurement circuit 208 may comprise an AGC measurement circuit 226 and a third digital adder 228.

The AFE 202 is the analog portion of AGC circuit 200. The analog amplifier 216 may be variable gain amplifier with programmable gain levels. The ADC 218 may be a fixed-bit or a programmable-bit analog-to-digital converter. The clamping circuit 204 may be a hardware resource where signal clamping takes place. The digital gain signal may be converted to a corresponding digital gain in clamping circuit 204. The first adder 220 may be a hardware resource where the clamp reference level is removed from the digitized signal output from ADC 218. The digital multiplier 222 may be a hardware resource where the output from the first digital adder 220 is amplified by the digital gain. The second digital adder 224 may be a hardware resource where the clamp reference level is restored to the output of digital multiplier 222. The clamp reference level circuit 206 may be a hardware resource that provides the clamp reference level.

The error measurement circuit 208 may be a hardware resource that compares a specified incoming signal amplitude parameter to a user-defined AGC reference level and generates an error signal. The AGC reference level circuit 210 may be a hardware resource that provides the AGC reference level utilized in error measurement circuit 208. The AGC measurement circuit 226 may be a hardware resource that measures the specified incoming signal amplitude parameter. The third digital adder 228 may be a hardware resource that compares the measured parameter and the AGC reference level. The loop filter circuit 212 may be a hardware resource that generates a system time constant and an average error signal from the error signal generated by error measurement circuit 208.

The analog/digital gain separation circuit 214 may be a hardware resource that generates a system gain from the average error gain. The analog/digital gain separation circuit 214 may generate an analog gain and an analog gain signal from the system gain. The generation of the analog gain and the analog gain signal may be achieved through the use of a look-up table. The analog signal gain is a signal that corresponds to the analog gain. The analog/digital gain separation circuit 214 may generate a digital gain and a digital gain signal from the system gain and from the analog gain. The digital signal gain is a signal that corresponds to the digital gain. At least one processor may be utilized to write or read data from registers, memory elements, or look-up tables in analog/digital gain separation circuit 214 to modify or update the generation of system gain, analog gain, analog gain signal, digital gain, and digital gain signal.

In operation, the incoming analog signals are received at the signal input of analog amplifier 216. The gain level of analog amplifier 216 may be selected at the gain input by the analog gain signal generated by analog/digital gain separation circuit 214. The signal output of analog amplifier 216 is coupled to the signal input of ADC 218. The incoming signal is converted to a digital value at ADC 218. The signal output from ADC 218 may be coupled to the signal input of clamping circuit 204. The signal input of clamping circuit 204 may be coupled to the first input of first digital adder 220. The signal output of clamping reference level circuit 206 may be coupled to the reference input of clamping circuit 204. The reference input of clamping circuit 204 may be coupled to the second input of first digital adder 220. First digital adder 220 may remove the clamp reference level from the digital signal. The clamp reference level may compose at least one of a plurality of corresponding signal amplitude parameters that AGC circuit 200 may remove based on the signal processing application and the type of signal that is received. For example, in video signal processing cases, the clamp reference level may represent the blank level of the video signal. In other applications, the clamping reference level may represent a DC level required for operation. Clamping reference level circuit 206 may provide a specified blank level which is to be removed from the digital signal.

The output of first digital adder 220 may be coupled to the input of digital multiplier 222. The digital gain signal from the digital gain output of analog/digital gain separation circuit 214 may be coupled to the gain input of clamping circuit 204. The gain input of clamping circuit 204 may be coupled to the gain input of digital multiplier 222. Clamping circuit 204 may convert the digital gain signal into a corresponding digital gain value before applying to digital multiplier 222 though the use of memory elements or look-up tables. Digital gain multiplier 222 may amplify the signal coming from an output of the first digital adder 220 by the digital gain. The output of gain multiplier 222 may be coupled to the first input of the second digital adder 224. The second input of second digital adder 224 may be coupled to the reference input of clamping circuit 204. Second digital adder 224 may be utilized to restore the clamp reference level to the digital signal coming from the output of digital multiplier 222.

The output of second digital adder 224 may be coupled to the signal input of error measurement circuit 208. The signal input of error measurement circuit 208 may be coupled to the signal input of AGC measurement circuit 226. AGC measurement circuit 226 may be configured to measure the specified signal amplitude parameter. For example, in video signal processing cases, AGC measurement circuit 226 may measure the sync amplitude, the sync tip level, and/or the blank level of the video signal. AGC measurement circuit 226 may utilize these measurements to update the AGC reference level in AGC reference level circuit 210 or the clamp reference level in clamp reference level 206. The signal output of AGC measurement circuit 226 is coupled to the first input of the third digital adder 228.

When the measurement is performed by AGC measurement circuit 226, the measured parameter is passed to third digital adder 228 for comparison with the AGC reference level. The signal output of AGC reference level circuit 210 is coupled to the reference input of error measurement circuit 208. The AGC reference level from AGC reference level circuit 210 may be at least one of a plurality of reference levels that may be used by error measurement circuit 208. For example, in video signal processing cases, the AGC reference level may represent the sync amplitude, the sync tip level, or the blank level of the video signal. The reference input of error measurement circuit 208 is coupled to the second input of third digital adder 228. Whether the first input or the second input of third digital adder 228 is negative may be dependent on system design and/or the operation of the error measurement circuit 208. The output of third digital adder 228 may be a comparison of the measured parameter and the AGC reference level. The output of third digital adder 228 may be coupled to the signal output of error measurement circuit 208. Error measurement circuit 208 may convert the signal output of third digital adder 228 into a corresponding error signal.

The signal output of error measurement circuit 208 may be coupled to the signal input of loop filter circuit 212. The error signal from error measurement circuit 208 may be averaged or processed by loop filter circuit 212 for a specified period of time to generate an average error signal and to generate a time response for AGC circuit 200. The operation of loop filter circuit 212 may be updated or modified by reading or writing data into one or more registers, memory elements and/or look-up tables. The signal output of loop filter circuit 212 may be coupled to the signal input of analog/digital gain separation circuit 214. The average error message generated by loop filter circuit 212 may be utilized by analog/digital gain separation circuit 214 to generate the system gain. Generating the system gain may be accomplished through the use of a look-up table. The contents of one or more memory elements, registers, and/or look-up tables may be updated to modify the system gain generation operation.

When the system gain has been generated, the analog/digital gain separation circuit 214 may generate the analog gain and the analog gain signal from that system gain. The analog gain and the analog gain signal may have the same value or they may have corresponding values. Generating the analog gain may be accomplished through the use of a look-up table. The contents of memory elements, registers, and/or look-up tables may be updated to modify the analog gain generation operation. The analog gain generation may be based on the operation and design of analog amplifier 202. An optimal or best choice analog gain is generated based on the system gain. The analog gain output of analog/digital gain separation circuit 214 is coupled to the gain input of analog amplifier 216. The analog gain signal may be utilized to select the gain level in analog amplifier 214 that corresponds to the analog gain generated in analog/digital gain separation circuit 214. Because most of the system gain is carried out by the analog gain in analog amplifier 214, the digital gain provided by digital multiplier 222 may be used for higher precision or trimming.

When the analog gain has been generated, the analog/digital gain separation circuit 214 may generate the digital gain and the analog gain signal from the system gain and the analog gain. The digital gain and the digital gain signal may have the same value or they may have corresponding values. Generating the digital gain may be accomplished through the use of a look-up table. The contents of memory elements, registers, and/or look-up tables may be updated to modify the digital gain generation operation. The digital gain signal may be utilized to select the gain level in digital multiplier 22 that corresponds to the digital gain generated in analog/digital gain separation circuit 214.

For purposes of illustration, assume the system gain generated by analog/digital gain separation circuit 214 under certain conditions may be 5.2. Analog amplifier 214 is able to provide gain levels of 0, 1, 2, 3, . . . 5, 6, 7, . . . 10 because that is the highest gain resolution it has been designed to provide. The digital multiplier is able to provide gain levels of 1, 1.1, 1.2, 1.3, . . . , 1.5. The highest overall system gain in this illustrative example is 15 while the minimum system gain is 1. The analog/digital gain separation circuit 214 may generate an analog gain of 4 and a digital gain of 1 to start. The system gain in this case is 4. The analog/digital gain separation circuit 214 may keep the same analog gain and increase the digital gain to 1.1. In this case the system gain provided by AGC circuit 200 is 4.4.

The analog/digital gain separation circuit 214 continues this process until the digital gain has reached 1.3, in which case the system gain is the desired 5.2. If the desired user-defined signal value changes so that a new system gain of 6.6 is needed, the analog/digital gain separation circuit 214 may continue to increase the digital gain until it reaches 1.5, which results in a system gain of 6. This system gain is lower than the 6.6 needed, so the analog/digital gain separation circuit 214 may generate a new analog gain of 5. The analog/digital gain separation circuit 214 may, at the same time as it increased the analog gain, reduce the digital gain which was previously set at 1.5, because keeping it at that level would generate a system gain of 7.5, much higher than the 6.6 needed. The analog/digital gain separation circuit 214 may finally reduce the digital gain to 1.3, resulting in a system gain of 6.5. On the other hand, the analog/digital gain separation circuit 214 may have generated a new system gain of 6 instead of 5, in which case it would need to reduce the digital gain to 1.1 for a system gain of 6.6. The generation of analog and digital gains may be dependent on certain error margins which may been specified at the beginning of operation or which may be specified after operation has started by writing data to registers, memory elements, and/or look-up tables in the analog/digital gain separation circuit 214.

Figure 2B:
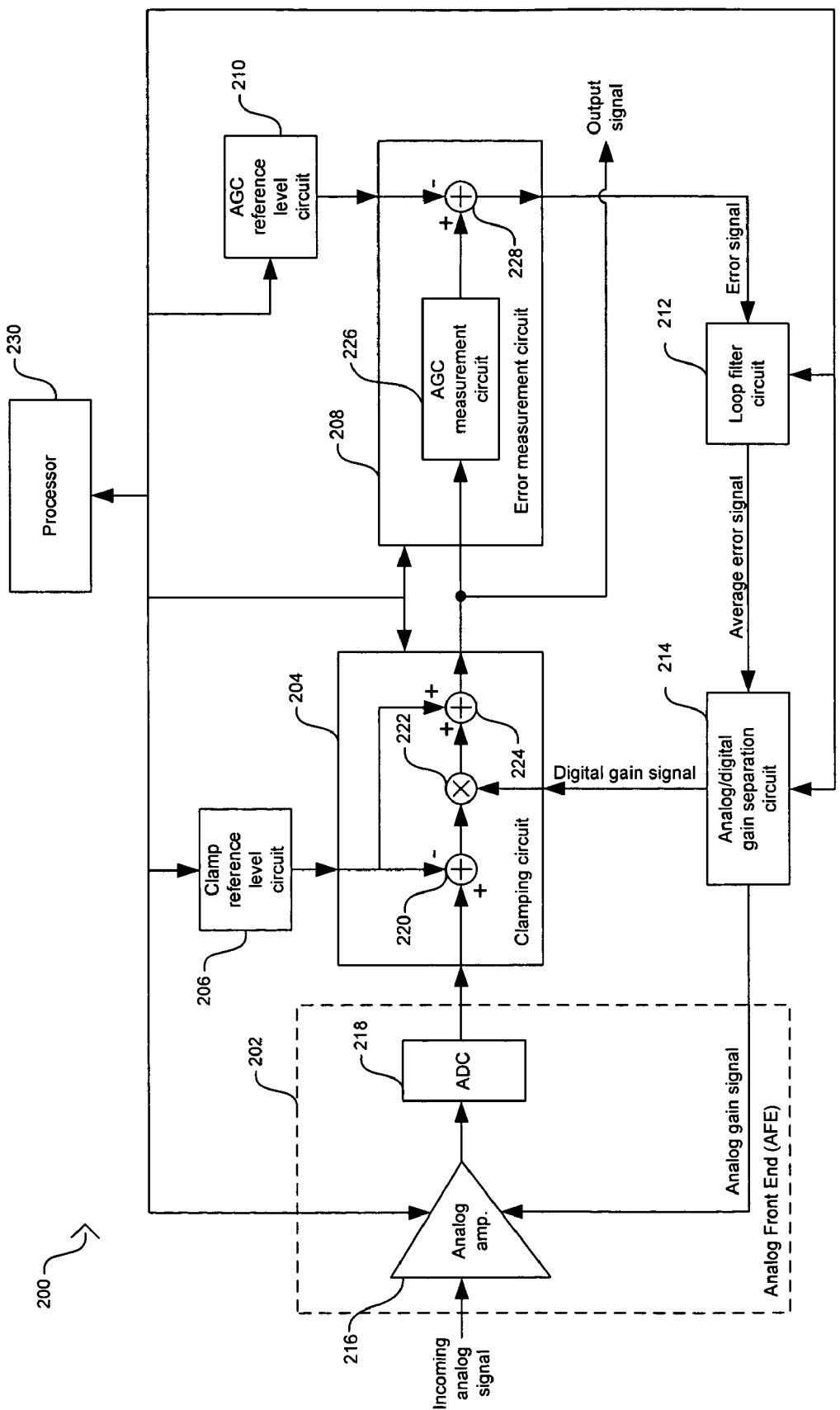
FIG. 2B is a schematic block diagram of a mixed analog-digital AGC circuit, in accordance with an embodiment of the present invention.

FIG. 2B is a schematic block diagram of a mixed analog-digital AGC circuit, in accordance with an embodiment of the present invention. Referring to FIG. 2B, the AGC circuit 200 may further comprise at least one processor 230. Processor 230 may be, for example, a core processor, a coprocessor, a microcontroller, a digital signal processor (DSP), or a hardware resource with processing capabilities. Processor 230 may be embedded on chip or may be external to the chip. Processor 230 may be used to transfer to or to receive from the analog/digital gain separation circuit 214 data, control signals, and/or instructions. Processor 230 may be used to update registers or memory elements in the analog/digital gain separation circuit 214 that may modify its operation. Processor 230 may be used to update look-up tables in the analog/digital gain separation circuit 214. Processor 230 may be used to transfer or receive data, control signals, and/or instructions from the clamping circuit 204, the clamp reference signal circuit 206, the error measurement circuit 208, the AGC reference level circuit 210, and the loop filter circuit 212. Processor 230 may be used to select the gain level in analog amplifier 216 and to indicate the number of bits to use in ADC 218 if it is programmable. Processor 230 may be used to generate new clamp reference levels and to generate new AGC reference levels. Processor 230 may be used to select which signal amplitude parameter to measure in AGC measurement circuit 226.

Figure 3A:
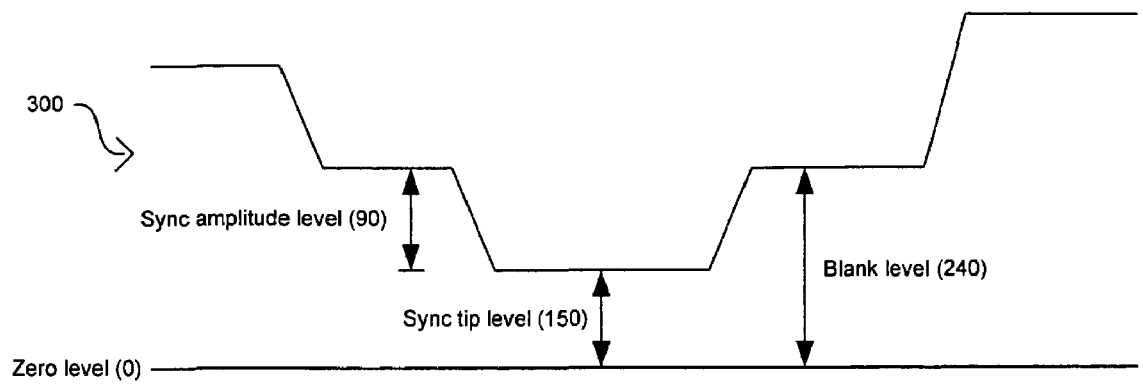
FIGS. 3A–3B illustrate exemplary steps that may be utilized by a digital multiplier, in accordance with an embodiment of the invention.
Figure 3B:
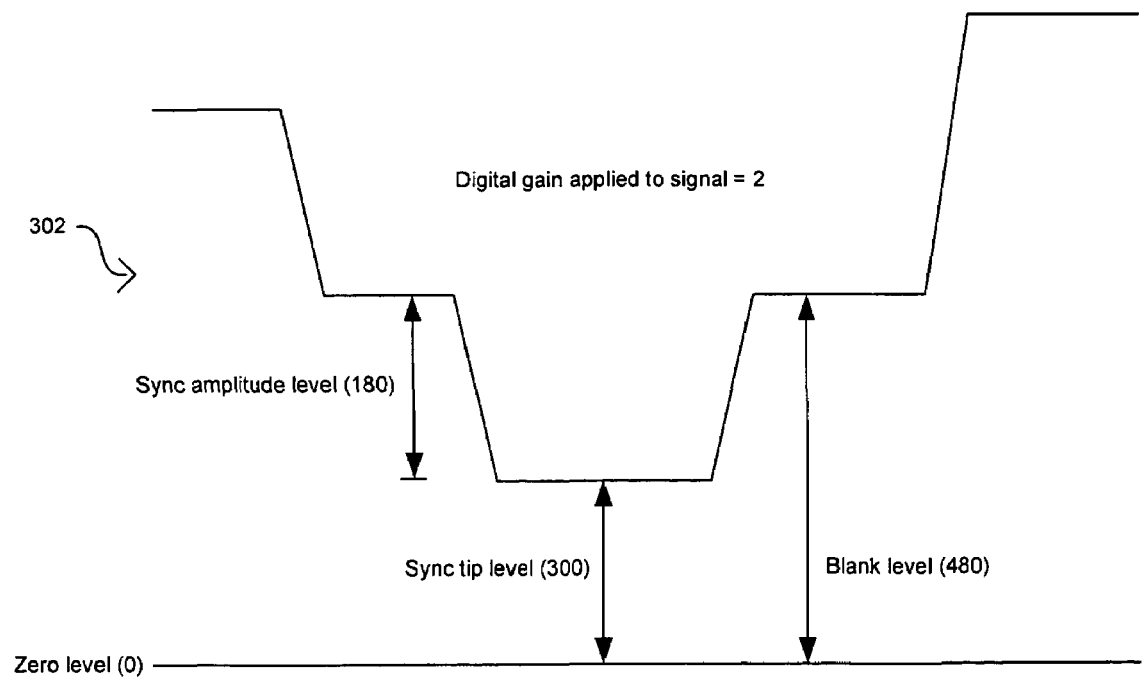

FIGS. 3A–3B illustrate exemplary steps that may be utilized by a digital multiplier, in accordance with an embodiment of the invention. Referring to FIGS. 3A–3B, this illustrative example shows how amplification by digital multiplier 222 affects video signals if the clamp reference level is not removed. In FIG. 3A, step 300 corresponds to the digital multiplier 222 receiving a video signal in which the clamp reference level has not been removed. The zero level in step 300 corresponds to digital 0, while the sync amplitude level, the sync tip level, and the blank level correspond to digital 90, 150, and 240 respectively. In this illustrative example, the blank level is the clamp reference level provided by clamp reference level circuit 206. In FIG. 3B, step 302 corresponds to the amplified video signal after a digital gain of 2 has been applied by digital multiplier 222 in order to increase either the sync amplitude level or the sync tip level. In step 302, the sync amplitude level, the sync tip level, and the blank level correspond to digital 180, 300, and 480 respectively. The blank level is now double of what it was in step 300, however, video applications may require this parameter to be 240. AGC measurement circuit 226 may recognize this situation and require AGC circuit 200 to generate a new system gain. The problem that may occur in this situation is that AGC circuit 200 may amplify either the sync amplitude level or the sync tip level, depending on which parameter has been selected for AGC operation. Any reduction in system gain to offset gains in the blank level would also reduce the signal amplitude parameters the AGC circuit 200 intended to amplify in the first place. This condition may occur if the clamp reference level provided by clamp reference level circuit 206 corresponds to digital 0 or if clamping circuit 204 omits to perform the removal of the clamp reference level before applying the digital gain.

Figure 4A:
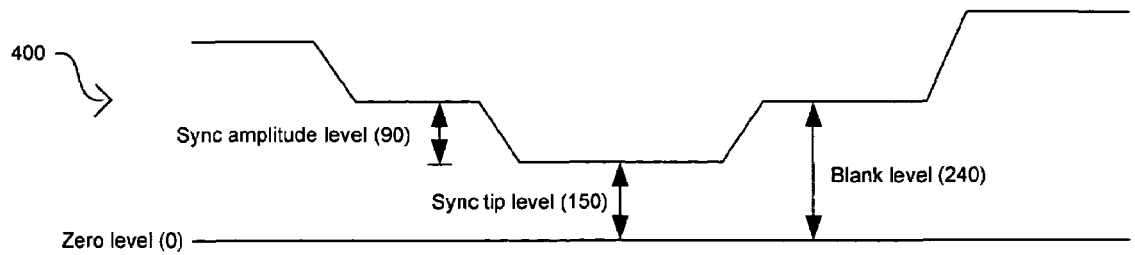
FIG. 4A–4D illustrate exemplary steps that may be utilized by a clamping circuit, in accordance with an embodiment of this invention.
Figure 4B:
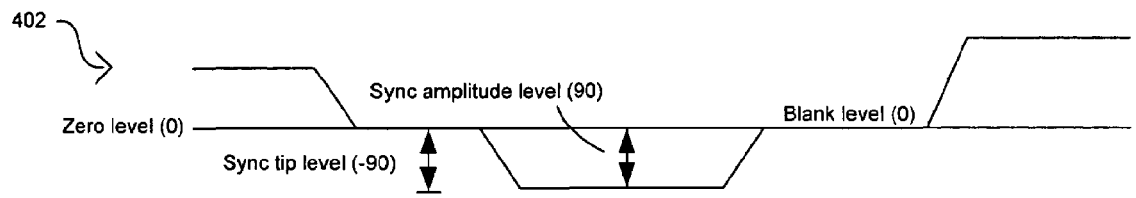
Figure 4C:
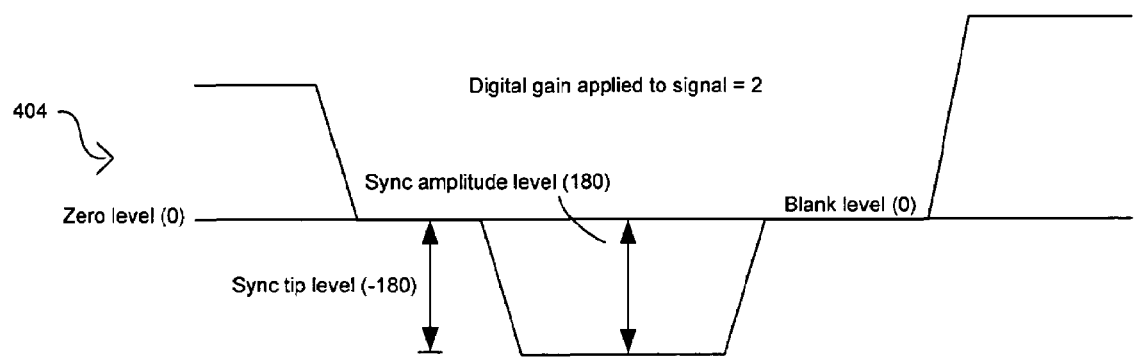
Figure 4D:
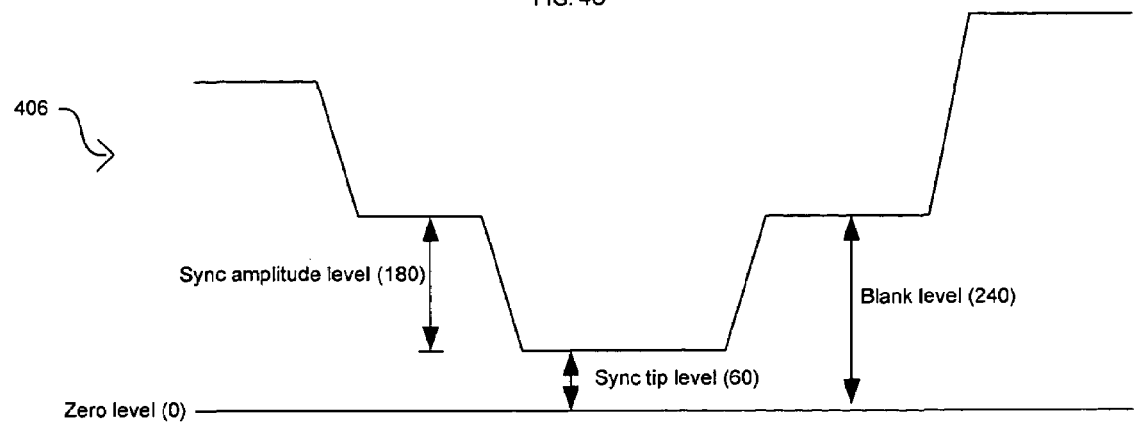

FIG. 4A–4D illustrate exemplary steps that may be utilized by a clamping circuit, in accordance with an embodiment of this invention. Referring to FIGS. 4A–B, this illustrative example shows the effect of clamp reference circuit 204 on the amplification of video signals. In FIG. 4A, step 400 corresponds to an incoming video signal after being digitized. The zero level corresponds to digital 0, while the sync amplitude level, the sync tip level, and the blank level correspond to digital 90, 150, and 240 respectively. FIG. 4B illustrates the effect of removing the clamp reference level. In this case, for example, the clamp reference level is the blank level of the video signal. Step 402 in FIG. 4B corresponds to the removal of the blank level by the first digital adder 220, resulting in sync amplitude level, sync tip level, and blank levels of digital 90, –90, and 0 respectively. In FIG. 4C, step 404 corresponds to the amplification of the clamped video signal digital multiplier 222 resulting in sync amplitude level, sync tip level, and blank level values of digital 180, –180, and 0 respectively. Step 406 in FIG. 4D illustrates the effect of restoring the blank level to the video signal. The sync amplitude level, the sync tip level, and the blank level now correspond to digital 180, 60, and 240 respectively. The blank level is the specified digital 240 while the sync amplitude level, the parameter selected for amplification in this illustrative example, has been multiplied by 2. Similar exemplary steps may be taken if amplification of the sync tip level is preferred.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system for signal gain control comprising:
a clamping circuit that clamps a reference level within a reduced gain received signal by using a clamp reference level, wherein said clamping circuit removes said clamp reference level from said reduced gain received signal prior to application of digital gain.

2. A method for signal gain control, the method comprising:
clamping a reference level within a reduced gain signal by using a clamp reference level;
applying a digital gain to said reduced gain signal wherein said digital gain compensates for at least a portion of said reduction in said analog gain to said reduced gain signal;
generating an error signal from a measurement of said clamped reduced gain signal and from an AGC reference level; and
generating an average error signal from said error signal.

3. A system for signal gain control, the system comprising:
a gain separation circuit that reduces an analog gain for a received signal in an analog amplifier;
a clamping circuit that clamps a reference level within said reduced gain received signal by using a clamp reference level;
said gain separation circuit applies a digital gain to said reduced gain received signal wherein said digital gain compensates for at least a portion of said reduction in said analog gain to said received signal; and
an error measurement circuit that generates an error signal from a measurement of said clamped reduced gain received signal and from an AGC reference level; and
a loop filter circuit that generates an average error signal from said error signal.

4. A method for signal gain control, the method comprising:
reducing an analog gain for a received signal in an analog amplifier;
clamping a reference level within said reduced gain received signal by using a clamp reference level; and
applying a digital gain to said reduced gain received signal wherein said digital gain compensates for at least a portion of said reduction in said analog gain to said received signal, wherein said clamping further comprises removing said clamp reference level from said reduced gain received signal prior to said application of said digital gain.

5. A method for signal gain control, the method comprising:
- reducing an analog gain for a received signal in an analog amplifier;
- clamping a reference level within said reduced gain received signal by using a clamp reference level;
- applying a digital gain to said reduced gain received signal wherein said digital gain compensates for at least a portion of said reduction in said analog gain to said received signal;
- generating an error signal from a measurement of said clamped reduced gain received signal and from an AGC reference level;
- generating an average error signal from said error signal;
- generating a system gain from said average error signal; and
- generating said analog gain and said digital gain from said system gain.

6. A method for signal gain control, the method comprising:
- reducing an analog gain for a received signal in an analog amplifier;
- clamping a reference level within said reduced gain received signal by using a clamp reference level;
- applying a digital gain to said reduced gain received signal wherein said digital gain compensates for at least a portion of said reduction in said analog gain to said received signal;
- generating an error signal from a measurement of said clamped reduced gain received signal and from an AGC reference level;
- determining a clamp reference level from said measurement of said clamped reduced gain received signal;
- generating an average error signal from said error signal;
- generating a system gain from said average error signal; and
- generating said analog gain and said digital gain from said system gain.

7. A method for signal gain control, the method comprising:
- reducing an analog gain for a received signal in an analog amplifier;
- clamping a reference level within said reduced gain received signal by using a clamp reference level;
- applying a digital gain to said reduced gain received signal wherein said digital gain compensates for at least a portion of said reduction in said analog gain to said received signal;
- generating an error signal from a measurement of said clamped reduced gain received signal and from an AGC reference level;
- updating said AGC reference level based on at least one measurement of said clamped reduced gain received signal;
- generating an average error signal from said error signal;
- generating a system gain from said average error signal; and
- generating said analog gain and said digital gain from said system gain.

8. A method for signal gain control, the method comprising:
- reducing an analog gain for a received signal in an analog amplifier;
- clamping a reference level within said reduced gain received signal by using a clamp reference level;
- applying a digital gain to said reduced gain received signal wherein said digital gain compensates for at least a portion of said reduction in said analog gain to said received signal;
- generating an error signal from a measurement of said clamped reduced gain received signal and from an AGC reference level;
- generating an average error signal from said error signal;
- generating a system gain from said average error signal;
- generating said analog gain and said digital gain from said system gain; and
- generating said system gain through use of a look-up-table.

9. A method for signal gain control, the method comprising:
- reducing an analog gain for a received signal in an analog amplifier;
- clamping a reference level within said reduced gain received signal by using a clamp reference level;
- applying a digital gain to said reduced gain received signal wherein said digital gain compensates for at least a portion of said reduction in said analog gain to said received signal;
- generating an error signal from a measurement of said clamped reduced gain received signal and from an AGC reference level;
- generating an average error signal from said error signal;
- generating a system gain from said average error signal;
- generating said analog gain and said digital gain from said system gain; and
- generating said analog gain through use of a look-up-table.

10. A method for signal gain control, the method comprising:
- reducing an analog gain for a received signal in an analog amplifier;
- clamping a reference level within said reduced gain received signal by using a clamp reference level;
- applying a digital gain to said reduced gain received signal wherein said digital gain compensates for at least a portion of said reduction in said analog gain to said received signal;
- generating an error signal from a measurement of said clamped reduced gain received signal and from an AGC reference level;
- generating an average error signal from said error signal;
- generating a system gain from said average error signal;
- generating said analog gain and said digital gain from said system gain; and
- generating said digital gain through use of a look-up-table.

11. A method for signal gain control, the method comprising:
- reducing an analog gain for a received signal in an analog amplifier;
- clamping a reference level within said reduced gain received signal by using a clamp reference level;
- applying a digital gain to said reduced gain received signal wherein said digital gain compensates for at least a portion of said reduction in said analog gain to said received signal;
- generating an error signal from a measurement of said clamped reduced gain received signal and from an AGC reference level;
- generating an average error signal from said error signal;
- generating a system gain from said average error signal;

generating said analog gain and said digital gain from said system gain; and modifying a time response of said system gain via a loop filter circuit.

12. A system for signal gain control, the system comprising:
- a gain separation circuit that reduces an analog gain for a received signal in an analog amplifier;
- a clamping circuit that clamps a reference level within said reduced gain received signal by using a clamp reference level; and
- said gain separation circuit applies a digital gain to said reduced gain received signal wherein said digital gain compensates for at least a portion of said reduction in said analog gain to said received signal, wherein said clamping circuit removes said clamp reference level from said reduced gain received signal prior to said application of said digital gain.

13. A system for signal gain control, the system comprising:
- a gain separation circuit that reduces an analog gain for a received signal in an analog amplifier;
- a clamping circuit that clamps a reference level within said reduced gain received signal by using a clamp reference level;
- said gain separation circuit applies a digital gain to said reduced gain received signal wherein said digital gain compensates for at least a portion of said reduction in said analog gain to said received signal;
- an error measurement circuit that generates an error signal from a measurement of said clamped reduced gain received signal and from an AGC reference level;
- a loop filter circuit that generates an average error signal from said error signal;
- said gain separation circuit generates a system gain from said average error signal; and
- said gain separation circuit generates said analog gain and said digital gain from said system gain.

14. A system for signal gain control, the system comprising:
- a gain separation circuit that reduces an analog gain for a received signal in an analog amplifier;
- a clamping circuit that clamps a reference level within said reduced gain received signal by using a clamp reference level;
- said gain separation circuit applies a digital gain to said reduced gain received signal wherein said digital gain compensates for at least a portion of said reduction in said analog gain to said received signal;
- an error measurement circuit that generates an error signal from a measurement of said clamped reduced gain received signal and from an AGC reference level, wherein said error measurement circuit determines a clamp reference level from said measurement of said clamped reduced gain received signal;
- a loop filter circuit that generates an average error signal from said error signal;
- said gain separation circuit generates a system gain from said average error signal; and
- said gain separation circuit generates said analog gain and said digital gain from said system gain.

15. A system for signal gain control, the system comprising:
- a gain separation circuit that reduces an analog gain for a received signal in an analog amplifier;
- a clamping circuit that clamps a reference level within said reduced gain received signal by using a clamp reference level;
- said gain separation circuit applies a digital gain to said reduced gain received signal wherein said digital gain compensates for at least a portion of said reduction in said analog gain to said received signal;
- an error measurement circuit that generates an error signal from a measurement of said clamped reduced gain received signal and from an AGC reference level, wherein said error measurement circuit updates said reference level based on at least one measurement of said clamped reduced gain received signal;
- a loop filter circuit that generates an average error signal from said error signal;
- said gain separation circuit generates a system gain from said average error signal; and
- said gain separation circuit generates said analog gain and said digital gain from said system gain.

16. A system for signal gain control, the system comprising:
- a gain separation circuit that reduces an analog gain for a received signal in an analog amplifier;
- a clamping circuit that clamps a reference level within said reduced gain received signal by using a clamp reference level;
- said gain separation circuit applies a digital gain to said reduced gain received signal wherein said digital gain compensates for at least a portion of said reduction in said analog gain to said received signal;
- an error measurement circuit that generates an error signal from a measurement of said clamped reduced gain received signal and from an AGC reference level;
- a loop filter circuit that generates an average error signal from said error signal;
- said gain separation circuit generates a system gain from said average error signal; and
- said gain separation circuit generates said analog gain and said digital gain from said system gain, wherein said gain separation circuit generates said system gain through use of a look-up-table.

17. A system for signal gain control, the system comprising:
- a gain separation circuit that reduces an analog gain for a received signal in an analog amplifier;
- a clamping circuit that clamps a reference level within said reduced gain received signal by using a clamp reference level;
- said gain separation circuit applies a digital gain to said reduced gain received signal wherein said digital gain compensates for at least a portion of said reduction in said analog gain to said received signal;
- an error measurement circuit that generates an error signal from a measurement of said clamped reduced gain received signal and from an AGC reference level;
- a loop filter circuit that generates an average error signal from said error signal;
- said gain separation circuit generates a system gain from said average error signal; and
- said gain separation circuit generates said analog gain and said digital gain from said system gain, wherein said gain separation circuit generates said digital gain through use of a look-up-table.

18. A system for signal gain control, the system comprising:
- a gain separation circuit that reduces an analog gain for a received signal in an analog amplifier;

a clamping circuit that clamps a reference level within said reduced gain received signal by using a clamp reference level;

said gain separation circuit applies a digital gain to said reduced gain received signal wherein said digital gain compensates for at least a portion of said reduction in said analog gain to said received signal;

an error measurement circuit that generates an error signal from a measurement of said clamped reduced gain received signal and from an AGC reference level;

a loop filter circuit that generates an average error signal from said error signal;

said gain separation circuit generates a system gain from said average error signal; and said gain separation circuit generates said analog gain and said digital gain from said system gain, wherein said gain separation circuit generates said analog gain through use of a look-up-table.

19. A system for signal gain control, the system comprising:

a gain separation circuit that reduces an analog gain for a received signal in an analog amplifier;

a clamping circuit that clamps a reference level within said reduced gain received signal by using a clamp reference level;

said gain separation circuit applies a digital gain to said reduced gain received signal wherein said digital gain compensates for at least a portion of said reduction in said analog gain to said received signal;

an error measurement circuit that generates an error signal from a measurement of said clamped reduced gain received signal and from an AGC reference level;

a loop filter circuit that generates an average error signal from said error signal;

said gain separation circuit generates a system gain from said average error signal;

said gain separation circuit generates said analog gain and said digital gain from said system gain; and a processor that updates registers, memory elements, and/or look-up tables in said gain separation circuit.

20. A system for signal gain control, the system comprising:

a gain separation circuit that reduces an analog gain for a received signal in an analog amplifier;

a clamping circuit that clamps a reference level within said reduced gain received signal by using a clamp reference level;

said gain separation circuit applies a digital gain to said reduced gain received signal wherein said digital gain compensates for at least a portion of said reduction in said analog gain to said received signal;

an error measurement circuit that generates an error signal from a measurement of said clamped reduced gain received signal and from an AGC reference level;

a loop filter circuit that generates an average error signal from said error signal;

said gain separation circuit generates a system gain from said average error signal;

said gain separation circuit generates said analog gain and said digital gain from said system gain; and said loop filter circuit modifies a time response of said system gain.

* * * * *